United States Patent
Kurahashi et al.

(10) Patent No.: US 6,815,727 B2
(45) Date of Patent: Nov. 9, 2004

(54) SEMICONDUCTOR LIGHT EMITTING DEVICE

(75) Inventors: Takahisa Kurahashi, Kashiba (JP); Tetsurou Murakami, Tenri (JP); Shouichi Ohyama, Nara-ken (JP); Hiroshi Nakatsu, Mihara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/601,755

(22) Filed: Jun. 24, 2003

(65) Prior Publication Data

US 2004/0036075 A1 Feb. 26, 2004

(30) Foreign Application Priority Data

Jun. 24, 2002 (JP) ........................................ 2002-183291

(51) Int. Cl.[7] ........................ H01L 29/06; H01L 33/00
(52) U.S. Cl. ................................ 257/94; 257/12; 257/13; 257/96; 257/98; 257/103; 438/22; 438/46; 438/47
(58) Field of Search ........................ 257/94, 96, 98, 257/103, 12–13; 438/22, 46, 47, 25–27

(56) References Cited

U.S. PATENT DOCUMENTS

2002/0185653 A1   12/2002   Kurahashi et al.

FOREIGN PATENT DOCUMENTS

| JP | 2001-68727 | | 3/2001 |
|---|---|---|---|
| JP | 2001-68732 | | 3/2001 |
| JP | 2001-068727 | * | 3/2001 |
| JP | 2002-076433 | | 3/2002 |
| JP | 2003-124508 | | 4/2003 |
| JP | 2003-209282 | | 7/2003 |

OTHER PUBLICATIONS

Streubel et al. "High Brightness Visible (660 nm) Resonant-Cavity Light–Emitting Diode" IEEE Photonics Technology Letters, vol. 10, No. 12, Dec. 1998, pp. 1685–1687.

* cited by examiner

*Primary Examiner*—Donghee Kang
(74) *Attorney, Agent, or Firm*—Morrison & Foerster LLP

(57) ABSTRACT

A resonant cavity type light emitting diode has a first DBR made of n-type AlAs or $Al_{0.5}Ga_{0.5}As$, a quantum well active layer, a second DBR made of p-type $(Al_{0.2}Ga_{0.6})_{0.5}In_{0.5}P$ or $Al_{0.5}In_{0.5}P$, and an n-type current constriction layer on an n-type GaAs substrate. The first DBR and the second DBR form a resonator. The quantum well active layer is formed in a position of an antinode of a standing wave inside the resonator. Between the second DBR and the current constriction layer, there is provided a p-type GaP etching protection layer that has a value obtained by dividing resistivity by thickness being $1 \times 10^3$ Ω or more. Since a current in a current flow pass formed in the current constriction layer hardly diffuses to the outside of the current flow pass, there is generated few region with low current density that causes deterioration of responsespeed in a quantum well layer. Thus, the light emitting diode has an excellent high-speed response.

11 Claims, 7 Drawing Sheets

SEMICONDUCTOR LIGHT EMITTING DEVICE

BACKGROUND OF THE INVENTION

The present invention relates to a semiconductor light emitting device.

In recent years, srmironrlrtcor light emitting devices have been widely used for information indication panels, optical communications and the like. These semiconductor light emitting devices are not only required to have high light emitting-efficiency, but also a high-speed response when they are used for optical communications in particular. Therefore, speed semiconductor light emitting devices having higher efficiency and quicker response are being vigorously developed.

A surface emitting type LED (Light Emitting Diode) allowing low current operation is drawing attention as a semiconductor light emitting device having high efficiency. However, the surface emitting type LED is relatively insufficient in high-speed response. The data transmission speed of the surface emitting type LED is at best around 100 Mbps to 200 Mbps. Consequently, a resonant cavity type LED has been developed. In the resonant cavity type LED, a light emission layer is located on an antinode of a standing wave formed by a resonator composed of two mirrors. Thereby, spontaneously emitted light is controlled to achieve high-speed response and high efficiency of the light emitting element (refer to Japanese Patent Laid-Open Publication HEI No. 3-229480 and U.S. Pat. No. 5,226,053). Recently, POF (Plastic Optical Fiber) has been used for high-speed communication system conforming to IEEE1394, USB2 and the like. As a preferable light source of POF, there has been developed a resonant cavity type LED in which AlGaInP based semiconductor material is used for its light emission layer. This LED enables high-efficient light emittance at a wavelength of 650 nm that is included in a low loss wavelength range in the POF (High Brightness Visible Resonant Cavity Light Emitting Diode: IEEE PHOTONICS TECHNOLOGY LETTERS VOL.10 NO.12 DECEMBER 1998).

However, the resonant cavity type LED having the AlGaInP based light emission layer has a problem in moisture resistance. The problem is caused by layers of AlAs and AlGaAs whose Al mix crystal ratio is close to 1 in the vicinity of the LED surface, as a result of using a multilayered reflection film made of AlGaAs based material as a mirror for forming a resonator. Also, the above-stated resonant cavity type LED has another problem that an optical output saturates when a current flow of several tens mA or more is applied. This problem is caused by insufficient diffusion of current because current applied from a surface of the LED diffuses only in DBR (Distributed Bragg Reflector) having approx. 1 $\mu$m thickness. For solving these problems, there has been proposed an idea of forming a surface electrode into the shape of a honeycomb or mesh with a width of several $\mu$m. However, such electrode has a drawback that breakage of the electrode is easily generated, which causes degraded reliability of LED.

Under these circumstances, there has been proposed a semiconductor light emitting device whose multilayered reflection film is composed of AlGaInP based materials, where the multilayered reflection film is formed on the surface side of the semiconductor light emitting device to constitute a resonator (refer to Japanese Patent Laid-Open Publication No. 2001-68732). This semiconductor light emitting device not only increases moisture resistance owing to the AlGaInP based materials which the multilayered reflection film of the device is made of, but also increases density of current applied onto a light emission layer owing to a current constriction layer. Further, a current diffusion layer is provided to solve the problem of optical output saturation.

In the above-stated conventional semiconductor light emitting device, however, current diffuses toward outside of a current flow pass formed by the current constriction layer. Thereby, the diffused current causes a low-current-density region to generate in the light emission layer. The low-current-density region is low in response speed, which causes a problem that the response speed of the entire device is decreased.

SUMMARY OF THE INVENTION

An object of the invention is to provide a semiconductor light emitting device having good high-speed response.

To achieve the object, the present invention provides a semiconductor light emitting device comprising:

a semiconductor substrate;

a first multilayered reflection film on the semiconductor substrate;

a light emission layer on the first multilayered reflection film;

a second multilayered reflection film made of $Al_yGa_zIn_{1-y-z}P$ ($0 \leq y \leq 1$, $0 \leq z \leq 1$) on the light emission layer;

a semiconductor layer on the second multilayered reflection film; and a current constriction layer on the semiconductor layer, wherein the first multilayered reflection film and the second multilayered reflection film form a resonator with a specified interval, and the light emission layer is formed in a position of an antinode of a standing wave inside the resonator, and wherein the semiconductor layer has a value obtained by dividing resistivity by thickness being $1 \times 10^3$ $\Omega$ or more.

Since the semiconductor layer has relatively large resistivity and relatively small carrier density, a current in a current flow pass formed in the current constriction layer will not easily diffuse to the outside of the current flow pass. Therefore, there is generated few region with low current density in the light emission layer, which effectively improves a response characteristic of the semiconductor light emitting device.

Herein, when the semiconductor layer between the second multilayered reflection film and the current constriction layer has a value smaller than $1 \times 10^3$ $\Omega$ obtained by dividing resistivity by thickness, an amount of current diffused to the outside of the current flow pass formed by the current constriction layer becomes so large as to pose bad influence to the response characteristic of the semiconductor light emitting device.

Conventionally, in the surface emitting type semiconductor light emitting device without resonator structure, a layer between the light emission layer and the current constriction layer was set to have a carrier density of approx. $3 \times 10^{18}$ $cm^{-3}$ for reducing series resistance. In such semiconductor light emitting device, it was not recognized that the carrier density of the layer between the light emission layer and the current constriction layer hindered increase of response speed. An inventor of the present invention has found out that the cause of current diffusion from the current flow pass formed in the current constriction layer correlates with the resistivity of the layer between the multilayered reflection film formed on the light emission layer and the current constriction layer, and has invented the present invention based thereon.

It is noted that throughout the specification, y and z in semiconductor compounds are independent in each semiconductor compound.

The present invention also provides a semiconductor light emitting device comprising:

a semiconductor substrate;

a first multilayered reflection film on the semiconductor substrate;

a light emission layer on the first multilayered reflection film;

a second multilayered reflection film made of $Al_yGa_zIn_{1-y-z}P$ ($0 \leq y \leq 1, 0 \leq z \leq 1$) on the light emission layer; and a current constriction layer on the second multilayered reflection film, wherein the first multilayered reflection film and the second multilayered reflection film form a resonator with a specified interval, and the light emission layer is formed in a position of an antinode of a standing wave inside the resonator, and wherein a percentage of a current diffused to an outside of a current flow pass formed in the current constriction layer is 25% or less of a total current applied to the current flow pass.

Since the current diffused to the outside of the current flow pass is 25% or less of the total current applied to the current flow pass, it is possible to reduce the region with low current density in the light emission layer to the extent that bad influence is not given to the response characteristic of the entire semiconductor light emitting device. On the contrary, if the percentage of the current diffused to the outside of the current flow pass formed in the current constriction layer is beyond 25% of the total applied current, the regions with low current density due to the current diffused to the outside of the current flow pass become excessive, which deteriorates the response characteristic of the entire semiconductor light emitting device.

In one embodiment of the present invention, the semiconductor light emitting device further comprises a current diffusion layer on the current constriction layer.

Acccrding to the above embodiment, the current applied from the surface of the semiconductor light emitting device is uniformly led by the current diffusion layer to the current flow pass formed in the current constriction layer. Therefore, it becomes possible to effectively reduce operating voltage of the semiconductor light emitting device.

In one embodiment of the present invention, the light emission layer is made of $Al_yGa_zIn_{1-y-z}P$ ($0 \leq y \leq 1, 0 \leq z \leq 1$). According to the above embodiment, it becomes possible to obtain emitted light at a wavelength range from 550 nm to 680 nm.

In one embodiment of the pregsent invention, a semiconductor layer made of $Al_yGa_zIn_{1-y-z}P$ ($0 \leq y \leq 1, 0 \leq z \leq 1$) is provided between the second multilayered reflection film and the current constriction layer.

Therefore, the semiconductor layer becomes transparent against the light with a wavelength of 550 nm or more, which enables highly effective extraction of emitted light with a wavelength of 550 nm or more.

In one embodiment of the present invention, a semiconductor layer made of GaP is provided between the second multilayered reflection film and the current constriction layer. The surface of this semiconductor layer is hardly oxidized, which makes it possible to grow a semiconductor layer with good crystallinity on top of this layer. As a result, it becomes possible to obtain a semiconductor light emitting device with less lattice mismatch and crystal defect and with good characteristics.

In one embodiment of the present invention, the current constriction layer is made of $Al_yGa_zIn_{1-y-z}P$ ($0 \leq y \leq 1, 0 \leq z \leq 1$). Consequently, the current constriction layer becomes transparent against the light with a wavelength of 550 nm or more, which enables highly effective extraction of emitted light with a wavelength of 550 nm or more.

In one embodiment of the present invention, the current constriction layer is made of GaP. The surface of this semiconductor layer ishardly oxidized, which makes it possible to grow a semiconductor layer with good crystallinity on top of this layer. As a result, it becomes possible to obtain a semiconductor light emitting device with less lattice mismatch and crystal defect and with good light-emitting characteristics.

In one embodiment of the present invention, the current diffusion layer is made of $A_yGa_zIn_{1-y-z}P$ ($0 \leq y \leq 1, 0 \leq z \leq 1$). Consequently, the current diffusion layer becomes transparent against the light with a wavelength of 550 nm or more, which enables highly effective extraction of emitted light with a wavelength of 550 nm or more.

Also, the semiconductor substrate is preferably made from GaAs in consideration of crystallinity of a semiconductor layer formed thereon.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 1A is a plane view showing a semiconductor light emitting device in a first embodiment of the present invention, while

FIG. 3A is a plane view showing the state of the semiconductor light emitting device in a manufacturing process different from that of FIG. 2, while

FIG. 6A is a plane view showing a semiconductor light emitting device in a second embodiment, while

FIG. 8A is a plane view showing the state of the manufacturing process of the semiconductor light emitting device different from that of FIG. 7, while

DETAIDED DESCRIPTION OF THE PREFERRED EMBODIMENTS

Hereinbelow, the present invention will be described in detail in conjunction with embodiments with reference to the drawings.

Figure 1A:
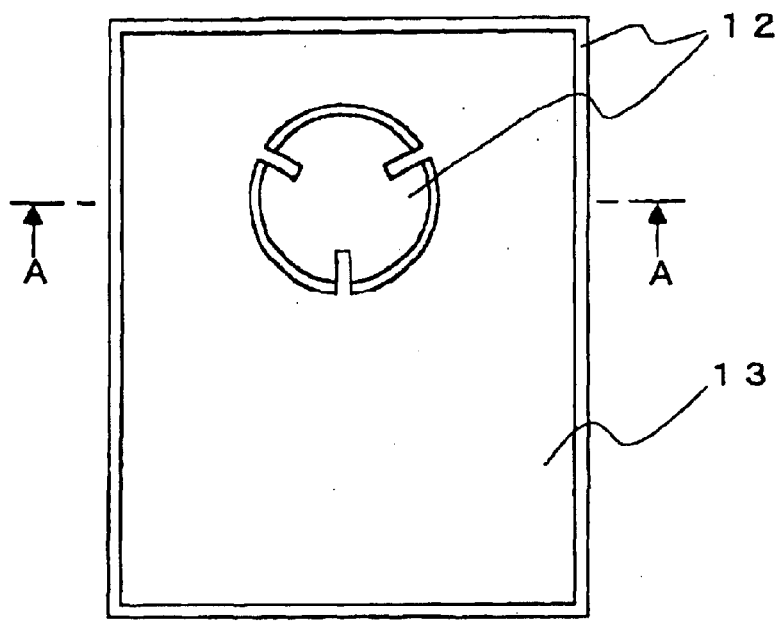
Figure 1B:
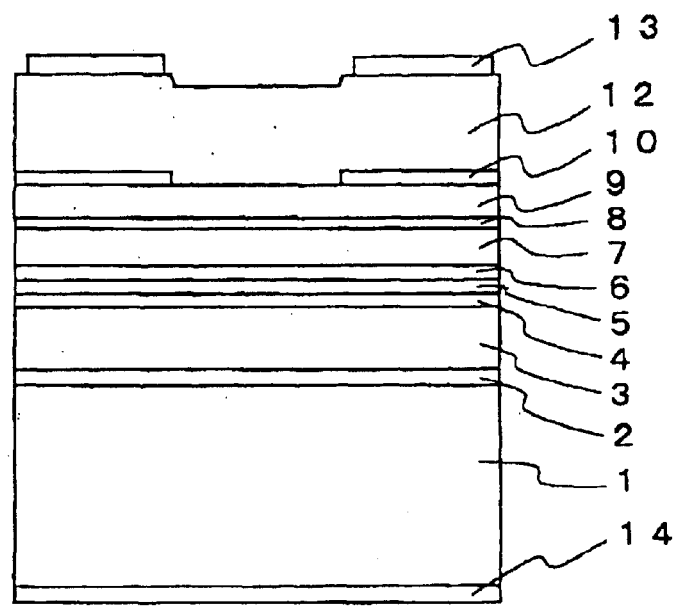
FIG. 1B is a cross sectional view taken along line A—A of FIG. 1A.
Figure 2:
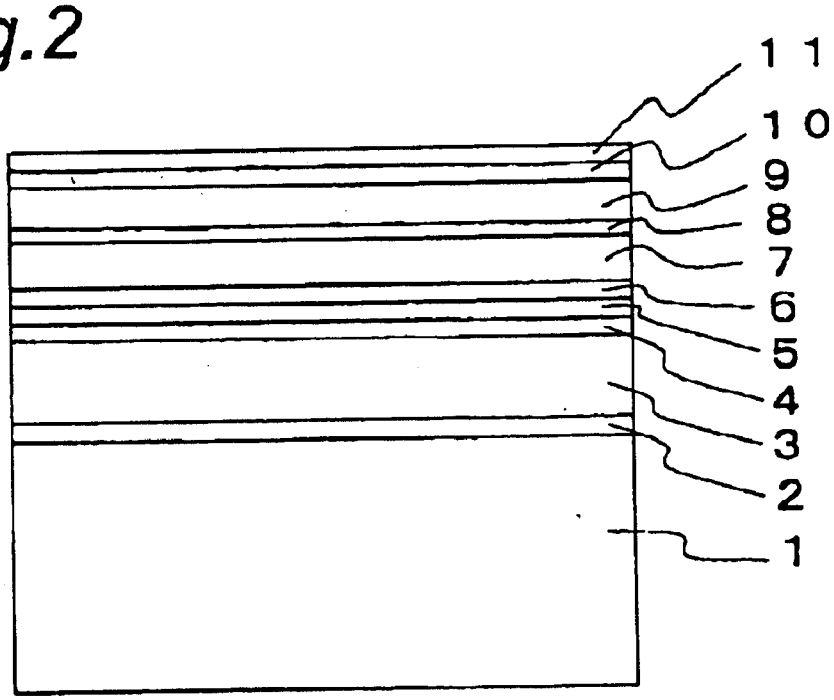
FIG. 2 is a cross sectional view showing the state of the semiconductor light emitting device of FIGS. 1A and 1B in a manufacturing process.
Figure 3A:
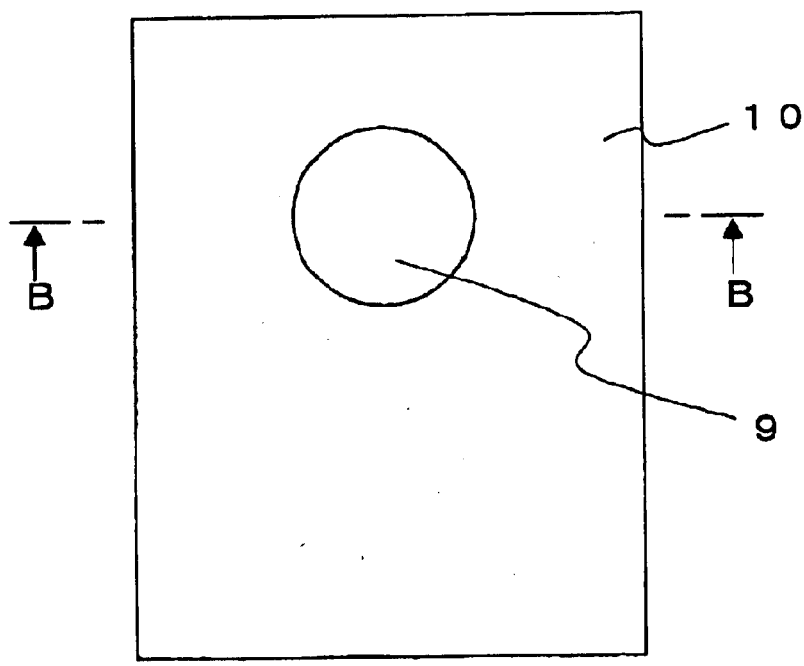
Figure 3B:
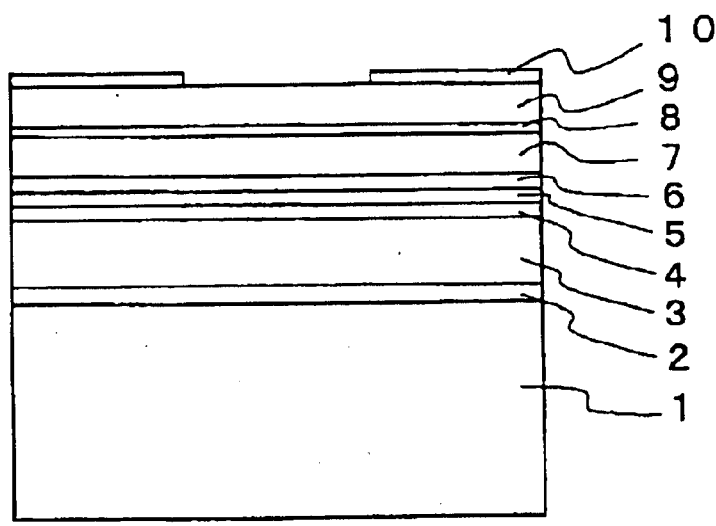
FIG. 3B is a cross sectional view taken along line B—B of FIG. 3A.

FIG. 1A is a plane view showing a semiconductor light emitting device in a first embodiment of the present invention. FIG. 1B is a cross sectional view taken along line A—A of FIG. 1A. FIG. 2 is a cross sectional view showing a state of the semiconductor light emitting device of FIGS. 1A and 1B in a manufacturing process. FIG. 3A is a plane view showing a state of the semiconductor light emitting device in a manufacturing process different from the manufacturing process shown in FIG. 2. FIG. 3B is a cross sectional view taken along line B—B of FIG. 3A.

The semiconductor light emitting device of the present embodiment is an AlGaInP based semiconductor light emitting device. First, on an n-type GaAs substrate 1 as a semiconductor substrate inclined 15° in [011] direction from (100) plane, there are laminated in sequence by MOCVD (Metal Organic Chemical Vapor Deposition) method an n-type Gas buffer layer 2 (layer thickness of 1pi, and carrier density of $5 \times 10^{17}$ $cm^{-3}$), as shown in FIG. 2, an n-type first DBR (Distributed Bragg Reflector) 3 (carrier density of $5 \times 10^{17}$ $cm^{-3}$) as a first multilayered reflection film, an n-type $(Al_{0.7}Ga_{0.3})_{0.5}In_{0.5}P$ first cladding layer 4 (carrier density of $5 \times 10^{17}$ $cm^{-3}$), a quantum well active layer 5 as a light emission layer, a p-type $(Al_{0.7}Ga_{0.3})_{0.5}In_{0.5}P$ second cladding layer 6 (carrier density of $5 \times 10^{17}$ $cm^{-3}$), a second DBR 7 (carrier density of $5 \times 10^{17}$ $cm^{-3}$) as a second multilayered reflection film, a p-type AlGaInP intermediate layer 8 (layer thickness of 0.1 $\mu$m, and carrier density of $5 \times 10^{18}$ $cm^{-3}$), a p-type GaP etching protection layer 9 (layer thickness of 1 $\mu$m, and carrier density of $1 \times 10^{18}$ $cm^{-3}$), an n-type GaP layer 10 (layer thickness of 0.3 $\mu$m, and carrier density of $3 \times 10^{18}$ $cm^{-3}$), and an undope GaAs cap layer 11 (layer thickness of 0.01 $\mu$m).

The first DBR 3 is formed by 30.5 pairs of n-type AlAs and n-type $Al_{0.5}Ga_{0.5}As$. The quantum well active layer 5 is formed by a GaInP well layer and an $Al_{0.5}Ga_{0.5})_{0.5}In_{0.5}P$ barrier layer. The second DBR 7 is formed by 12 pairs of p-type $Al_{0.2}Ga_{0.8})_{0.5}In_{0.5}P$ and p-type $Al_{0.5}In_{0.5}P$.

Herein, the n-type first DBR 3 and the p-type second DBR 7 are formed such that a center of reflectance spectrum is 650 nm. An interval between the DBRs 3 and 7, that is, a resonator length is adjusted so that a resonance wavelength of a resonator composed of these two DBRs 3, 7 becomes 650 nm. In the present embodiment, the resonator length is set to be equal to two wavelengths. Further, the quantum well active layer 5 is formed so as to position at an antinode of a standing wave generated in the resonator composed of the above two DBRs 3, 7, and to have an emission peak wavelength of 650 nm.

The n-type GaAs cap layer 11 is then removed with sulfuric acid/hydrogen peroxide etchant. Thereafter, part of the n-type GaP layer 10 is etched off till the p-type GaP etching protection layer 9 is exposed by using photo lithography and sulfuric acid/hydrogen peroxide etchant. As shown in FIGS. 3A and 3B, this etching process forms a circular opening of 70 $\mu$m in diameter, which functions as a current flow pass, so as to form the n-type GaP current constriction layer 10.

After that, a p-type AlGaInP current diffusion layer 12 is laminated on the p-type etching protection layer 9 and the n-type current constriction layer 10, as shown in FIG. 1. The p-type AlGaInP current diffusion layer 12 is formed such that a total layer thickness is 7 $\mu$m A lower 1 $\mu$m-thick portion of the layer 12 has a carrier density of $1 \times 10^{18}$ $cm^{-3}$ while an upper 6 $\mu$m-thick portion of the layer 12 has a carrier density of $1 \times 10^{19}$ $cm^{-3}$. Then, on the p-type current diffusion layer 12, AuBe/Au is deposited. The deposited AuBe/Au is etched by photo lithography and Au echant and then heat-treated to obtain a p-type electrode 13. Meanwhile, a back face of the GaAs substrate 1 is polished to have a thickness of approx. 280 $\mu$m. On the polished face of the GaAs substrate 1, AuGe/Au is deposited and heattreated to form an n-type electrode 14.

A response characteristic of thus-manufactured semiconductor light emitting device was examined, and the result of the examination indicated that the rise time was 2.1 ns. In contrast, the rise time was 2.6 ns in the case where the carrier density of the AlGaInP etching protection layer 29 was set to conventional $3 \times 10^{18}$ $cm^{-3}$. The examination result confirms that the response characteristic of the semiconductor light emitting device was improved by decreasing the carrier density of the GaP etching protection layer 9.

Figure 4:
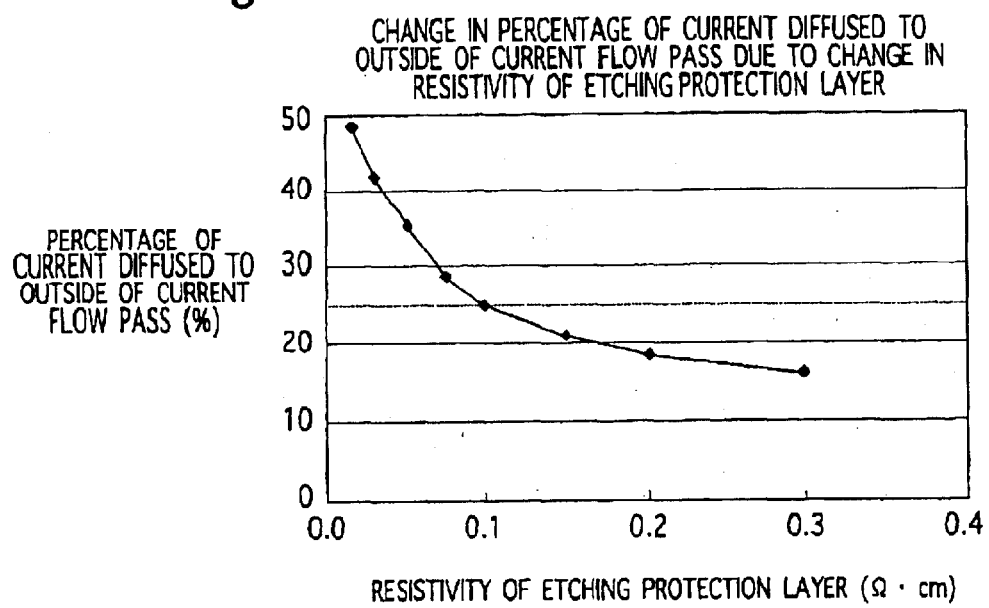
FIG. 4 is a view showing change of a current diffused to the outside of a current flow pass when resistivity of an etching protection layer 9 is changed.

Electric current diffusing outside of the current flow pass of the GaP current constriction layer 10 is examined when resistivity of the etching protection layer 9 is changed. FIG. 4 is a graph showing examined results thereof. In FIG. 4, the horizontal axis indicates resistivity ($\Omega$cm) of the etching protection layer 9, whereas the vertical axis indicates percentage (%) of current diffused to the outside of the current flow pass with respect to the total applied current. Thickness of the etching protection layer 9 is 1 $\mu$m in all the cases.

As shown in FIG. 4, as the resistivity of the etching protection layer 9 becomes larger, the percentage of the current diffused to the outside of the current flow pass becomes smaller.

Figure 5:
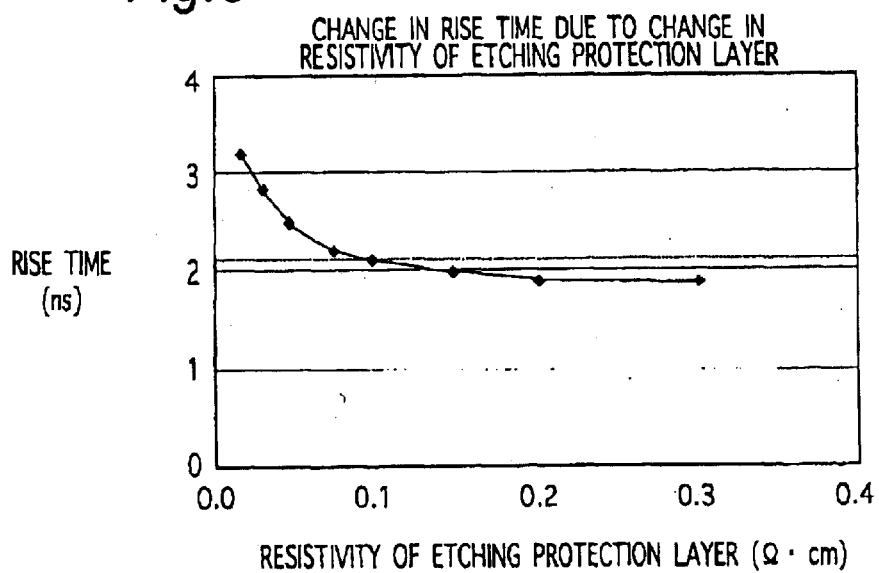
FIG. 5 is a view showing change of rise time of the semiconductor light emitting device when resistivity of an etching protection layer 9 is changed.

Changes in rise time of the semiconductor light emitting device are measured when resistivity or the etching protection layer 9 is changed. FIG. 5 is a graph showing measured results thereof. In FIG. 5, the horizontal axis indicates resistivity ($\Omega$cm) of the etching protection layer 9, whereas the vertical axis indicates rise time (ns) that is a time elapsed from application of operating voltage to emission of light. Thickness of the etching protection layer 9 is 1 $\mu$m in all the cases.

As shown in FIG. 5, as the resistivity becomes smaller than 0.1 $\Omega$cm, the rise time rapidly becomes large. In this case, a value calculated by dividing the resistivity 0.1 $\Omega$cm by the layer thickness 1 is equal to $1 \times 10^{3}$ $\Omega$. More specifically, when the value obtained by dividing resistivity by layer thickness becomes smaller than $1 \times 10^{3}$ $\Omega$, the rise time of the semiconductor light emitting device rapidly increases. This is because a region of low current density in the light emission layer increases by increase of the current diffused to the outside of the current flow pass. More specifically, a response time to application of current with regard to light emission is long in the region of low current density, which brings about remarkable delay of the response speed of the entire semiconductor light emitting device. As shown in FIGS. 4 and 5, when the current diffused to the outside of the current flow pass exceeds 25% of the total applied current, delay in rise time of the entire semiconductor light emitting device becomes remarkable. Therefore, by restraining the current diffused outside the current flow pass to 25% or less with respect to the entire, applied current, it becomes possible to effectively prevent the rise time of the semiconductor light emitting device from delaying.

The p-type intermediate layer 8 has resistivity as large as approx. 0.3 $\Omega$cm, and has a layer thickness smaller than the etching protection layer 9. Therefore, the p-type intermediate layer 8 hardly affects current diffusion from the current flow pass.

A current passing test of the semiconductor light emitting device of the present invention was carried out by applying 50mA current in an atmosphere where the temperature was 80° C. and the humidity was 85%. As a result of the test, a optical output after the lapse of 1000 hours was 95% of the initial optical output, which proved that the semiconductor light emitting device was sufficiently proof against humidity. The initial optical output was 2.2 mW when applied current was 20 mA. The operating voltage when the applied current was 20 mA was 2.2V. This enables the current from the p-type electrode 13 to sufficiently diffuse into the current diffusion layer 12 and to reach the center of the circular opening on the current constriction layer 10. Thereby, the current is uniformly applied to the current flow pass formed by this circular opening. As a result, current may be uniformly applied with high current density to the quantum well active layer 5 as a light emission layer, which enables a semiconductor light emitting device to operate in a low voltage with high speed response.

In the present embodiment, the p-type GaP etching protection layer 9 is formed between the second DBR 7 and the current constriction layer 10, where a value obtained by dividing resistivity with layer thickness is larger than $1\times10^3$ Ω. However, any semiconductor layer other than the etching protection layer may be used as long as the layer be positioned between the second multilayered reflection film and the current constriction layer. For a material of this semiconductor layer, $Al_xGa_{1-x}As$ ($0 \leq x \leq 1$) is also usable. However, since this layer is required to be transparent against an emission wavelength, an Al mix crystal ratio in the AlGaAs layer needs to be increased as the emission wavelength becomes shorter. When the Al mix crystal ratio is increased, the layer surface is easily oxidized. Thereby, a layer laminated on this layer is deteriorated in crystallinity. Therefore, a layer between the second multilayered reflection film and the current constriction layer is preferably formed by $Al_yGa_zIn_{1-y-z}P$ ($0 \leq y \leq 1$, $0 \leq z \leq 1$) when an emission wavelength of the semiconductor light emitting device is short. Although GaP is used for the current constriction layer in this embodiment, AlGaAs ($0 \leq x \leq 1$) may also be used as a material of this layer. However, the layer is preferably transparent against any emission wavelengths. When a layer between the second multilayered reflection film and the current constriction layer is $Al_yGa_zIn_{1-y-z}P$, ($0 \leq y \leq 1$, $0 \leq z \leq 1$), it is more difficult to secure crystallirity of the laminated layer in the case of using AlGaAs for the current constriction layer because another layer should be laminated on a layer having different elements P, As belonging to V-group. Also, although $Al_{0.01}Ga_{0.98}In_{0.01}P$ is used for the current diffusion layer in this embodiment, $Al_xGa_{1-x}As$ ($0 \leq x \leq 1$) may be used as a material of this layer. However, since the layer needs to be transparent against an emission wavelength, $Al_yGa_zIn_{1-y-z}P$ ($0 \leq y \leq 1$, $0 \leq z \leq 1$) is preferably used when the emission wavelength is short. $Al_yGa_zIn_{1-y-z}P$ ($0 \leq y \leq 1$, $0 \leq z \leq 1$) is small in Al mix crystal ratio and high in moisture resistance. Also, it is possible to do without the AlGaInP intermediate layer 8.

Figure 6A:
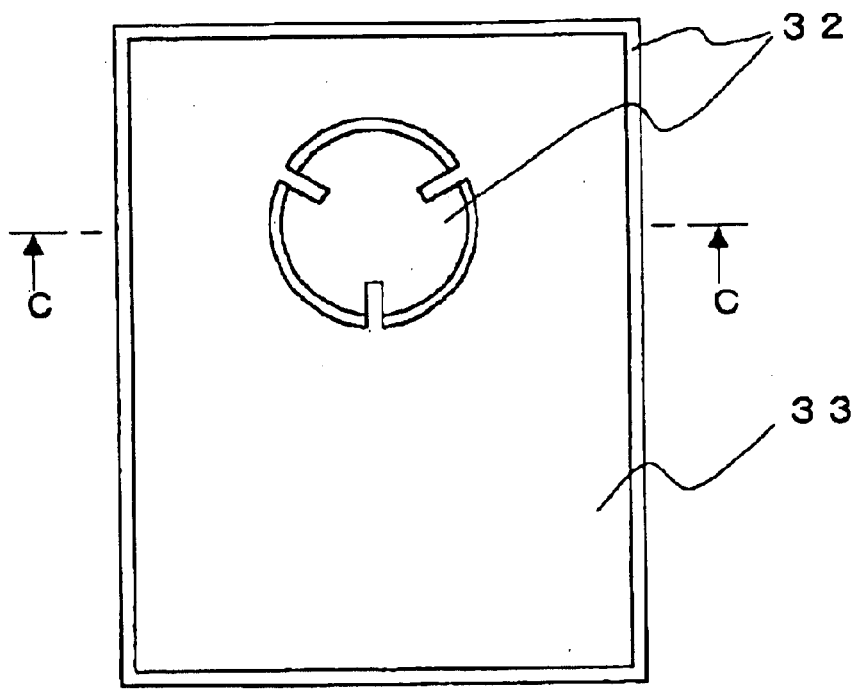
Figure 6B:
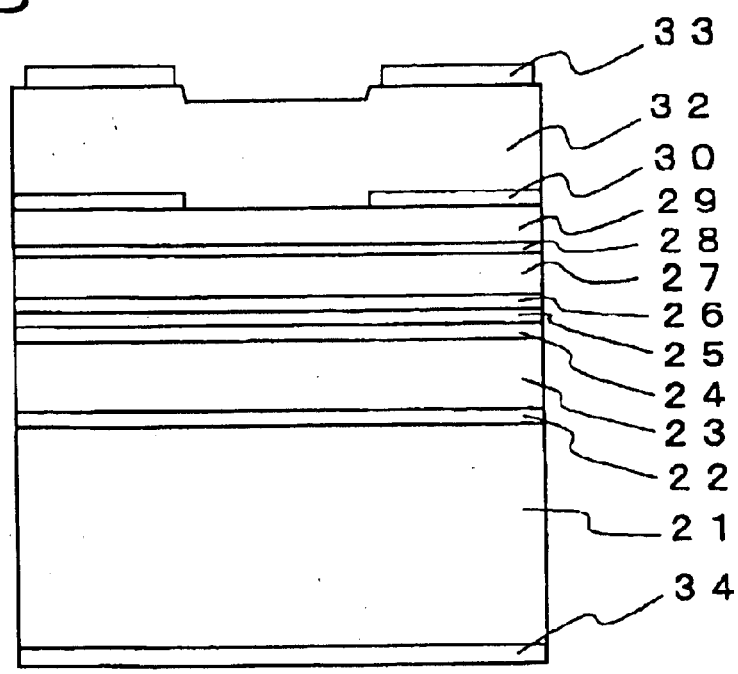
FIG. 6B is a cross sectional view taken along line C—C of FIG. 6A.
Figure 7:
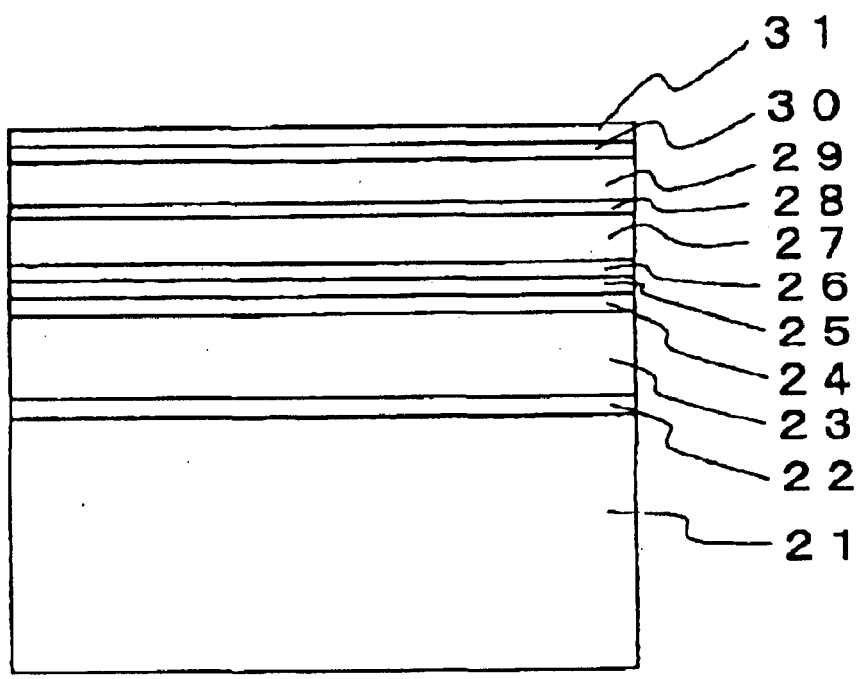
FIG. 7 is a cross sectional view showing the state of the semiconductor light emitting device of FIGS. 6A and 6B in a manufacturing process.
Figure 8A:
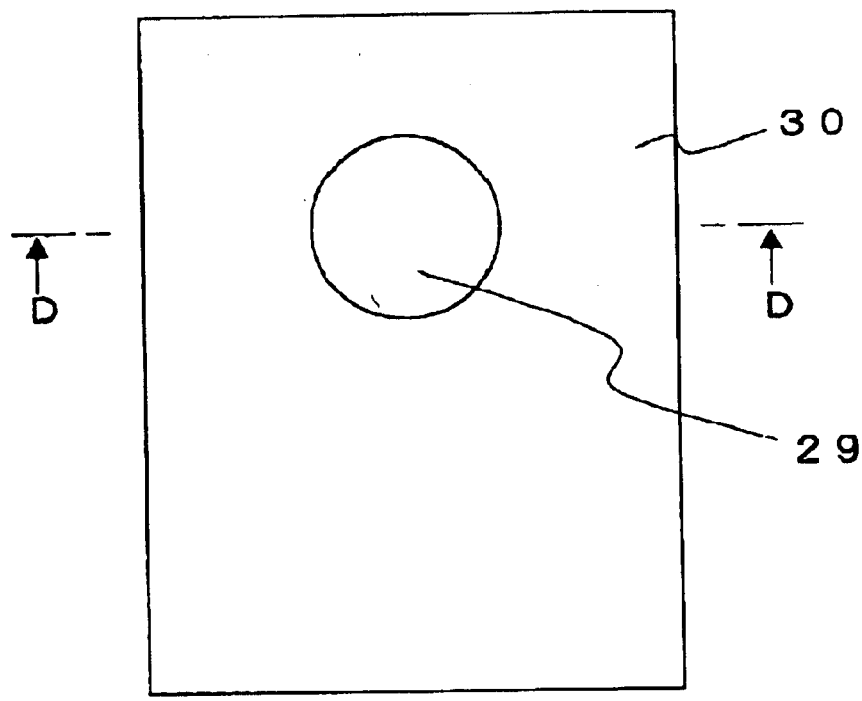
Figure 8B:
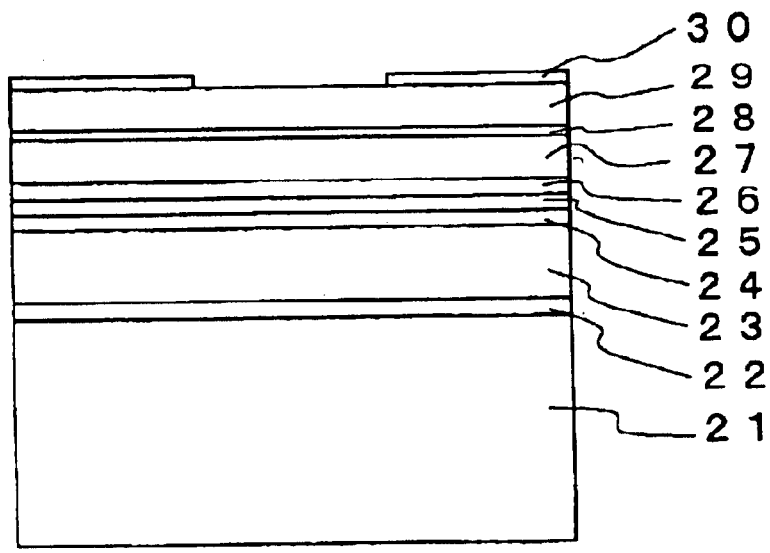
FIG. 8B is a cross sectional view taken along line D—D of FIG. 8A.

FIG. 6A is a plane view showing a semiconductor light emitting device in a second embodiment of the present invention. FIG. 6B is a cross sectional view taken along line C—C of FIG. 6A. FIG. 7 is a cross sectional view showing the state of the semiconductor light emitting device of FIGS. 6A and 6B in a manufacturing process. FIG. 8A is a plane view showing the state of the semiconductor light emitting device of FIGS. 6A and 68 in a manufacturing process different from that of FIG. 7. FIG. 8B is a cross sectional view taken along line D—D of FIG. 8A.

The semiconductor light emitting device of the present invention is a AlGaInP based semiconductor light emitting device. On an n-type GaAs substrate 21 inclined 15° in [011] direction from (100) plane, there are laminated in sequence by MOCVD method, as shown in FIG. 7, an n-type Gays buffer layer 22 (layer thickness of 1 μm, and carrier density of $5\times10^{17}$ cm$^{-3}$) an n-type first DBR 23 (carrier density of $5\times10^{17}$ cm$^{-3}$), an n-type $Al_{0.5}In_{0.5}P$ first cladding layer 24 (carrier density of $5\times10^{17}$ cm$^{-3}$), a quantum well active layer 25, a p-type $Al_{0.5}In_{0.5}P$ second cladding layer 26 (carrier density of $5\times10^{17}$ cm$^{-3}$), a p-type second DBR 27 (carrier density of $5\times10^{17}$ cm$^{-3}$), a p-type AlGaInP intermediate layer 28 (layer thickness of 0.1 μm, and carrier density of $5\times10^{18}$ cm$^{-3}$), a p-type $Al_{0.01}Ga_{0.98}In_{0.01}P$ etching protection layer 29 (layer thickness of 1μm, and carrier density of $1\times10^{39}$ cm$^{-3}$), an n-type $Al_{0.01}Ga_{0.98}In_{0.01}P$ current constriction layer 30 (layer thickness of 0.3 μm, and carrier density of $3\times10^{18}$ cm$^{-3}$), and an undope GaAs cap layer 31 with a thickness of 0.01 μm.

The n-type first DBR 23 is formed by 35.5 pairs of n-type AlAs and n-type $Al_{0.6}Ga_{0.4}As$. The quantum well active layer 25 is formed by a $(Al_{0.3}Ga_{0.7})_{0.5}In_{0.5}P$ well layer and an $(Al_{0.7}Ga_{0.3})_{0.5}P$ barrier layer. The p-type second DBR is formed by 17 pairs of p-type $(Al_{0.4}Ga_{0.6})_{0.5}In_{0.5}P$ and p-type $Al_{0.5}In_{0.5}P$.

Herein, the n-type first DBR 23 and the p-type second DBR 27 are formed such that a center of each reflectance spectrum is 570 nm. An interval between the DBRs 23 and 27, that is, a resonator length is adjusted so that a resonance wavelength of a resonator becomes 570 nm, the resonator being composed of these two DBRs 23, 27. In the present embodiment, the resonator length is set to be equal to two wavelengths. Further, the quantum well active layer 25 is positioned at an antinode of a standing wave generated in the resonator composed of the above two DBRs 23, 27, and to have an emission peak wavelength of 570 nm.

Then, after the n-type GaAs cap layer 31 is removed with sulfuric acid/hydrogen peroxide etchant, part of the n-type $Al_{0.01}Ga_{0.98}In_{0.01}P$ current constriction layer 30 is etched off till the p-type $Al_{0.01}Ga_{0.98}In_{0.01}P$ etching protection layer 29 is exposed by using photo lithography and sulfuric acid/hydrogen peroxide etchant. As shown in FIGS. 8A and 8B, this etching process forms a circular opening of 70 μm in diameter, which functions as a current flow pass, so as to form the n-type $Al_{0.01}Ga_{0.98}In_{0.01}P$ current constriction layer 30.

Thereafter, as shown in FIG. 6, a p-type AlGaInP current diffusion layer 32 is laminated on the n-type current constriction layer 30 and the p-type etching protection layer 29. The p-type current diffusion layer 32 is formed such that a total layer thickness is 7 μm. A lower 1 μm-thick portion has a carrier density of $1\times10^{18}$ cm$^{-3}$ while an upper 6 μm-thick portion has a carrier density of $1\times10^{19}$ cm$^{-3}$. Then, AuBe/Au is deposited on the p-type current diffusion layer 32. The deposited AuBe/Au is etched by Au etchant after photo lithography, and then heat-treated to obtain a p-type electrode 33. Meanwhile, the back face of the GaAs substrate 21 is polished to have a thickness of approx. 280 μm. AuGe/Au is deposited on the polished face of the GaAs substrate, and is heat-treated to form an n-type electrode 34.

A response characteristic of thus-manufactured semiconductor light emitting device was examined, and the result of the examination indicated that the rise time was 1.8 ns. In contrast, the rise time was 2.5 ns in the case where the carrier density of the AlGaInP etching protection layer 29 was set to conventional $3\times10^{18}$ cm$^{-3}$. The examination result confirms that the response characteristic of the semiconductor light emitting device was improved by decreasing the carrier density of the AlGaInP etching protection layer 29.

The semiconductor light emitting device of the present embodiment is different from the first embodiment in the point that the etching protection layer 29 is formed by $Al_{0.01}Ga_{0.98}In_{0.01}P$. When compared with the GaP etching protection layer 9 of the semiconductor light emitting device in the first embodiment, the resistivity thereof increases byseveral % in the same carrier density since Al and In are respectively contained by 1% in the present embodiment. Therefore, increased resistivity makes it possible to restrain a percentage of the current diffused to the outside of the current flow pass to the low level even if the layer thickness of the etching protection layer is incremented.

A current passing test of the semiconductor light emitting device of the present invention was carried out with applied current of 50 mA in an atmosphere where the temperature was 80° C. and the humidity was 85%. As a result of the test, a percentage of optical output after the lapse of 1000 hours was 105% of the initial optical output, which proved that the semiconductor light emitting device was sufficient proof against humidity. The initial optical output was 0.4 mW when applied current was 20 mA. Further, the operating voltage was 2.2V when the applied current was 20 mA. As with the first embodiment, the current is uniformly applied to the current flow pass which is formed by this circular opening. This is achieved by sufficiently diffusing the current from the p-type electrode 33 into the current diffusion layer 32, to reach the center of the circular opening on the current constriction layer 30. As a result, the current is uniformly applied to the quantum well active layer 25 in high current density. Thus, a semiconductor light emitting device having high speed response and operating in a low voltage can be obtained.

In the present embodiment, the p-type AlGaInP etching protection layer 29 is formed between the second DBR 27 and the current constriction layer 30, and a value obtained by dividing resistivity by layer thickness is larger than $1 \times 10^3$ Ω. However, any semiconductor layer other than the etching protection layer may be used as long as the semiconductor layer be positioned between the second multilayered reflection film and the current constriction layer. Also, it is possible to do without the AlGaInP intermediate layer 28.

In the semiconductor light emitting device of the first or second embodiment, p type and n type may be reversely used.

As mentioned above, the semiconductor light emitting device of the present embodiments is provided with a resonator that is formed by a first multilayered reflection film on the side of a semiconductor substrate and a second multilayered reflection film on the side far from the semiconductor substrate. The second multilayered reflection film is made of $Al_yGa_zIn_{1-y-z}P$ ($0 \leq y \leq 1$, $0 \leq z \leq 1$). Also, the semiconductor light emitting device is provided with a semiconductor layer located between the second multilayered reflection film and a current constriction layer, the semiconductor layer having a value calculated by dividing resistivity by thickness being $1 \times 10^3$ Ω or more. This makes it difficult to diffuse a current from a current flow pass, which is formed in the current constriction layer, to the outside of the current flow pass. Thereby, a region of low current density is hardly generated in the light emission layer. As a result, it becomes possible to effectively improve the response characteristic of the semiconductor light emitting device.

In the semiconductor light emitting device according to the present invention, a current diffused to the outside of the current flow pass formed in the current constriction layer is 25% or less of the total current applied to the current flow pass. This makes it possible to decrease generation of the low current density region in the light emission layer, bad influence is hardly posed on the response characteristic of the entire semiconductor light emitting device.

The invention being thus described, it will be obvious that the invention may be varied in many ways. Such variations are not be regarded as a departure from the spirit and scope of the invention, and all such modifications as would be obvious to one skilled in the art are intended to be included within the scope of the following claims.

What is claimed is:

1. A semiconductor light emitting device comprising:
   a semiconductor substrate;
   a first multilayered reflection film on the semiconductor substrate;
   a light emission layer on the first multilayered reflection film;
   a second multilayered reflection film made of $Al_yGa_zIn_{1-y-z}P$, wherein $0 \leq y \leq 1$ and $0 \leq z \leq 1$, on the light emission layer;
   a semiconductor layer on the second multilayered reflection film; and
   a current constriction layer on the semiconductor layer,
   wherein the first multilayered reflection film and the second multilayered reflection film form a resonator with a specified interval, and the light emission layer is formed in a position of an antinode of a standing wave inside the resonator, and
   wherein the semiconductor layer has a value obtained by dividing resistivity by thickness being $1 \times 10^3$ Ω or more.

2. The semiconductor light emitting device as defined in claim 1, further comprising a current diffusion layer on the current constriction layer.

3. The semiconductor light emitting device as defined in claim 1, wherein
   the semiconductor substrate is made of GaAs,
   the light emission layer is made of $Al_yGa_zIn_{1-y-z}P$, wherein $0 \leq y \leq 1$ and $0 \leq z \leq 1$, and
   the semiconductor layer is made of $Al_yGa_zIn_{1-y-z}P$, wherein $0 \leq y \leq 1$ and $0 \leq z \leq 1$, or GaP.

4. The semiconductor light emitting device as defined in claim 1, wherein
   the semiconductor substrate is made of GaAs,
   the semiconductor layer is made of $Al_yGa_zIn_{1-y-z}P$ ($0 \leq y \leq 1$, $0 \leq z \leq 1$) or GaP, and
   the current constriction layer is made of $Al_yGa_zIn_{1-y-z}P$, wherein $0 \leq y \leq 1$ and $0 \leq z \leq 1$, or GaP.

5. The semiconductor light emitting device as defined in claim 1, wherein
   the semiconductor substrate is made of GaAs,
   the semiconductor layer is made of $Al_yGa_zIn_{1-y-z}P$, wherein $0 \leq y \leq 1$ and $0 \leq z \leq 1$, or GaP,
   a current diffusion layer is provided on the current constriction layer, and
   is made of $Al_yGa_zIn_{1-y-z}P$, wherein $0 \leq y \leq 1$ and $0 \leq z \leq 1$.

6. A semiconductor light emitting device comprising:
   a semiconductor substrate;
   a first multilayered reflection film on the semiconductor substrate;
   a light emission layer on the first multilayered reflection film;

a second multilayered reflection film made of $Al_yGa_zIn_{1-y-z}P$, wherein $0 \leq y \leq 1$ and $0 \leq z \leq 1$, on the light emission layer;

a semiconductor layer on the second multilayered reflection film said semiconductor layer having a carrier density; and a current constriction layer on the semiconductor layer, wherein the first multilayered reflection film and the second multilayered reflection film form a resonator with a specified interval, and the light emission layer is formed in a position of an antinode of a standing wave inside the resonator, and wherein said carrier density of the semiconductor layer is set such that a percentage of a current diffused to an outside of a current flow pass formed in the current constriction layer is 25% or less of a total current applied to the current flow pass.

7. A The semiconductor light emitting device as defined in claim 6, further comprising a current diffusion layer on the current constriction layer.

8. The semiconductor light emitting device as defined in claim 6, wherein the semiconductor substrate is made of GaAs, the light emission layer is made of $Al_yGa_zIn_{1-y-z}P$, wherein $0 \leq y \leq 1$ and $0 \leq z \leq 1$, and the semiconductor layer is made of $Al_yGa_zIn_{1-y-z}P$ wherein $0 \leq y \leq 1$ and $0 \leq z \leq 1$, or GaP.

9. The semiconductor light emitting device as defined in claim 6, wherein the semiconductor substrate is made of GaAs, the semiconductor layer is made of $Al_yGa_zIn_{1-y-z}P$, wherein $0 \leq y \leq 1$ and $0 \leq z \leq 1$, or GaP, and the current constriction layer is made of $Al_yGa_zIn_{1-y-z}P$, wherein $0 \leq y \leq 1$ and $0 \leq z \leq 1$, or GaP.

10. The semiconductor light emitting device as defined in claim 6, wherein the semiconductor substrate is made of GaAs, the semiconductor layer is made of $Al_yGa_zIn_{1-y-z}P$, wherein $0 \leq y \leq 1$ and $0 \leq z \leq 1$, or GaP, a current diffusion layer is provided on the current constriction layer, and the current diffusion layer is made of $Al_yGa_zIn_{1-y-z}P$, wherein $0 \leq y \leq 1$ and $0 \leq z \leq 1$.

11. The semiconductor light emitting device as defined in claim 6, wherein the carrier density is $1 \times 10^{18}$ cm$^{-3}$.

* * * * *